(12) United States Patent
Burdett

(10) Patent No.: US 7,266,361 B2
(45) Date of Patent: Sep. 4, 2007

(54) MULTIMODE RECEIVER

(75) Inventor: Alison Burdett, Abingdon (GB)

(73) Assignee: Toumaz Technology Limited, Oxfordshire (GB)

( * ) Notice: Subject to any disclaimer, the term of this patent is extended or adjusted under 35 U.S.C. 154(b) by 0 days.

(21) Appl. No.: 10/531,446

(22) PCT Filed: Oct. 17, 2003

(86) PCT No.: PCT/GB03/04484

§ 371 (c)(1),
(2), (4) Date: Jan. 17, 2006

(87) PCT Pub. No.: WO2004/036777

PCT Pub. Date: Apr. 29, 2004

(65) Prior Publication Data

US 2006/0126702 A1    Jun. 15, 2006

(30) Foreign Application Priority Data

Oct. 17, 2002  (GB) .................................. 0224133.9

(51) Int. Cl.
*H04B 1/16* (2006.01)
(52) U.S. Cl. ...................... 455/334; 455/323; 455/324; 455/335
(58) Field of Classification Search ................ 455/130, 455/313, 323, 341, 334, 335, 324; 375/136, 375/336
See application file for complete search history.

(56) References Cited

U.S. PATENT DOCUMENTS

| | | | | |
|---|---|---|---|---|
| 5,095,533 A | * | 3/1992 | Loper et al. .............. | 455/245.1 |
| 5,564,076 A | | 10/1996 | Auvray | |
| 5,896,562 A | * | 4/1999 | Heinonen ...................... | 455/76 |
| 5,963,112 A | * | 10/1999 | Moschytz .................... | 333/172 |
| 6,016,422 A | * | 1/2000 | Bartusiak ...................... | 455/76 |
| 6,029,052 A | * | 2/2000 | Isberg et al. ................. | 455/131 |
| 6,085,104 A | * | 7/2000 | Kowalski et al. ........... | 455/506 |
| 6,420,940 B1 | * | 7/2002 | Minnis et al. .............. | 332/103 |
| 6,515,609 B1 | * | 2/2003 | Moulsley .................... | 341/155 |
| 6,590,943 B1 | * | 7/2003 | Ali .............................. | 375/332 |

(Continued)

FOREIGN PATENT DOCUMENTS

EP    0 682 458    11/1995

(Continued)

OTHER PUBLICATIONS

D. Breuckmann, "Rekonfiguierbare HF-Teile, Die Loesung Fuer Mobilfunkgeraete Der Zukunft?", ITG Fachberichte, VDE Verlag, Berlin, DE, No. 160, May 10, 2000, pp. 83-94 (with English translation).

*Primary Examiner*—Edan Orgad
*Assistant Examiner*—RuiMeng Hu
(74) *Attorney, Agent, or Firm*—Wenderoth, Lind & Ponack, L.L.P.

(57) ABSTRACT

An electric circuit suitable for use as a radio receiver or part of a radio receiver, the electric circuit comprising amplification means, frequency mixer means, and filter means, wherein the frequency mixer mans is configurable to down-convert a wanted component of the amplified input signal to one of at least two intermediate frequency bands, and the filter means is dynamically reconfigurable between a first filter configuration which provides a first operating mode, and a second filter configuration which provides a second operating mode.

20 Claims, 7 Drawing Sheets

U.S. PATENT DOCUMENTS

| | | | |
|---|---|---|---|
| 6,714,765 B1* | 3/2004 | Kimppa | 455/76 |
| 7,031,688 B2* | 4/2006 | Malone et al. | 455/318 |
| 7,082,293 B1* | 7/2006 | Rofougaran et al. | 455/260 |
| 7,116,945 B2* | 10/2006 | Moloudi et al. | 455/78 |
| 2001/0016480 A1* | 8/2001 | Okanobu | 455/318 |
| 2001/0041584 A1* | 11/2001 | Watanabe | 455/553 |
| 2002/0003844 A1 | 1/2002 | Doetsch et al. | |
| 2002/0127972 A1* | 9/2002 | Marshall et al. | 455/78 |
| 2002/0150174 A1* | 10/2002 | Spiegel et al. | 375/316 |
| 2004/0127187 A1* | 7/2004 | Peterson et al. | 455/323 |
| 2005/0170805 A1* | 8/2005 | Hammes et al. | 455/255 |

FOREIGN PATENT DOCUMENTS

| | | |
|---|---|---|
| EP | 1 098 449 | 5/2001 |
| WO | 92/07422 | 4/1992 |
| WO | 92/21195 | 11/1992 |
| WO | 99/34625 | 7/1999 |
| WO | 02/15384 | 2/2002 |
| WO | WO 200227953 * | 4/2002 |
| WO | WO 3055086 A1 * | 7/2003 |

* cited by examiner

MULTIMODE RECEIVER

The present invention relates to an electric circuit suitable for use as a radio receiver or as part of a radio receiver.

A proliferation of standards and modulation techniques for wireless communications has emerged in response to the particular requirements of different applications. These modulation schemes range from simple amplitude modulation (AM) and frequency modulation (FM) to complex multi-carrier digital modulation schemes such as wideband code-division multiple access (WCDMA) and coded orthogonal frequency domain multiplexing (COFDM). This proliferation in standards has led to the development of many different receiver architectures, which are optimised for specific applications.

A modem wireless communications receiver typically has two main parts, an analogue front-end, and a digital back-end. The digital back-end performs such functions as demodulation, decoding, error correction, etc. The analogue front-end typically down converts a particular wanted channel to a low enough frequency to enable it to be digitised (or otherwise further processed), while ensuring that no corruption from adjacent channel signals occurs.

The analogue front-end can be considered as a 'black box' which takes a band of input signals, and converts the particular wanted channel down to a known frequency, referred to as the intermediate frequency (IF). There are various well-known analogue front ends, the most popular of these being the superheterodyne, zero-IF and low-IF. These front-ends are commonly referred to in the prior art as being "receivers" although they do not include digital back-ends. Thus the term "receiver" as used is the following text should not be taken to imply the presence of digital electronics; neither should it be taken to exclude the presence of digital electronics.

The superheterodyne receiver is widely used because it provides very high selectivity. In one possible arrangement an RF input signal is applied to a low noise amplifier (LNA) and is then fed to an image reject (IR) filter which is typically implemented by a surface acoustic wave (SAW) filter. The signal output from the IR-filter is fed to a single mixer where it is combined with a signal from a local oscillator (LO) to perform frequency downconversion to the intermediate frequency (IF). This IF signal is fed through an IF bandpass filter which performs channel selection at the IF. The IF filter is also typically implemented using a SAW filter, although other filter architectures may be used.

The main issue in superheterodyne receiver design is the trade-off between image rejection and channel selection. If the chosen IF is high, the image signal will be greatly attenuated by the IR filter but adjacent channel suppression may not be good. Conversely if the IF is low the image will not be well attenuated although adjacent channels will be well-suppressed. The frequency plan in a superheterodyne receiver must thus be carefully chosen given the input signal frequency and adjacent channel conditions, and often conversion from RF to a final IF occurs in more than one step, requiring additional mixer and local oscillator stages.

The superheterodyne receiver has very good selectivity (i.e. can accurately select the wanted channel and reject unwanted channels), but requires a number of very selective filters which can only be implemented as discrete (off-chip) components. The off-chip filters will significantly increase overall system area and cost.

Zero-IF and low-IF receivers eliminate the need for off-chip filters, and thus are attractive for applications where low power consumption and high integration (minimum size) are important. These two receivers differ in the selection of the down converted intermediate frequency (IF).

For zero-IF, the centre of the wanted signal channel is placed at zero Hz. As a result, one half of the wanted signal channel is located in the positive frequency domain and the other half is in the negative frequency domain. Effectively, the two halves (sidebands) of the wanted signal channel 'overlap'. To avoid signal corruption, it is necessary to use a quadrature receiver architecture having two, quadrature mixers, with I and Q paths. The quadrature receiver architecture allows signal information to be recovered from the overlapping signal channel sidebands, by combining I and Q channel information. This is recovery is typically done by a digital back-end.

An advantage of the zero-IF receiver is that the wanted channel is converted very quickly to baseband (zero Hz), and thus only low frequency filters and amplifiers are needed on-chip (easy to design). In addition, although the signal channel sidebands overlap in I and Q paths, the signal is effectively interfering with itself, and so the 'interferer' power is the same as the 'wanted' power. However a major disadvantage is that any low frequency noise and offsets which are present in the receiver will directly corrupt the wanted signal channel, since it is centred at zero. In sub-micron CMOS technologies this low frequency noise can be quite significant.

In a low-IF architecture, the wanted channel is converted to a low frequency so that, as in zero-IF, the filters and amplifiers required are easy to design. However, the IF is chosen so that it is in a region where noise and offsets are not a problem. Consider a wanted signal at frequency $f_{RF}$. This signal is converted to the low IF $f_{IF}$ by multiplying it with an oscillator signal $f_{LO}=f_{RF}-f_{RF}$. However there could well be another channel picked up by the antenna at a frequency $f_{IM}=f_{LO}-f_{IF}$. When this signal is multiplied by the local oscillator (LO) it will be converted to $-f_{IF}$, i.e. the negative frequency 'image' to the wanted channel. So the wanted channel (at positive frequencies) is now overlapped by this image channel (at negative frequencies). In a similar manner to the zero-IF approach, these overlapping signals can be separated by using a quadrature architecture (I and Q paths), and performing suitable signal processing (complex filtering). An alternative approach would be to instead ensure that the interfering signal at frequency $f_{IM}=f_{LO}-f_{IF}$ is filtered out before reaching the multiplier. However, recall that the wanted channel is $f_{IF}$ above the LO, while the interfering image is $f_{IF}$ below the LO. Since $f_{IF}$ is small, a very sharp filter would be needed in order to pass the wanted channel and reject the image. In practice this is impossible to achieve, and so a low-IF receiver does not reject the image at RF, but instead rejects it at the low IF. A typical low-IF architecture makes use of a quadrature mixer followed by a complex bandpass filter centred at the low IF.

The main disadvantage of the low-IF receiver architecture compared to a zero IF receiver architecture is that in zero-IF the interfering signal is the wanted channel itself, while in low-IF the interfering signal is some other channel. The other channel could have a power many times greater than that of the wanted channel, which makes signal recovery much more difficult than in the zero-IF case. To improve receiver performance in the presence of a strong image channel signal, the low-IF receiver architecture can be modified to provide some additional image rejection at the RF frequency. This can be achieved by generating quadrature RF signals which are then converted down to the low IF using a full complex mixer (i.e. four separate mixers). The quadrature (I and Q) RF signals can be generated by using an RF polyphase filter, or by using a first stage of quadrature mixers prior to the full complex mixer. The use of a full complex mixer plus RF quadrature generation stage (i.e. a complex low-IF topology) will thus increase image channel rejection compared to the quadrature low-IF topology, but at the cost of increased receiver circuit complexity and possibly degraded receiver sensitivity.

It is often very desirable that a particular receiver should be able to receive signals transmitted under a number of different broadcast standards which may have different signal modulation characteristics. As an example, a multi-standard wireless communications receiver may be required to detect and decode new third generation standards such as wideband code division multiple access (WCDMA), while also being capable of receiving signals transmitted under the GSM or DECT standards. It would be highly desirable to have a single receiver integrated circuit capable of handling these different communication standards.

One approach to the design of such a multi-band multi-standard receiver would be to implement a separate receiver structure for each separate broadcast standard, and then integrate each of these parallel receivers into a single integrated circuit. In this way, each separate receiver could be optimised in terms of performance for the particular standard it will receive, for example by selecting the most suitable receiver architecture and circuit implementation. However a significant disadvantage of such an approach is that a large amount of silicon area will be required at high system cost.

The prior art includes attempts to solve this problem. A prior art switchable multi-standard receiver is described in WO02/27953A12. The receiver uses a conventional direct conversion architecture, and comprises three filter stages and three LNAs. The filter stages and the LNAs are selected using switches, depending on the broadcast standard of the incoming signal (e.g. GSM, UMTS or DECT). Common elements of the receiver, a mixer and digital baseband, are connected to each of the outputs of the LNAs. Although the filters and LNAs may be selected for different broadcast standards, the receiver suffers from the disadvantage that the mode of receiver operation is unchanged, i.e. the mode of operation is always direct conversion, as dictated by the architecture of the receiver.

EP1006669A1 describes a prior art superheterodyne receiver. In this receiver a common LNA and mixer are used for all received broadcast standards. The receiver includes multiple switchable filters, a particular filter being selected to receive a particular broadcast standard and frequency band. Although the filters may be selected for different broadcast standards, the mode of operation of the receiver itself is fixed (i.e. superheterodyne) as dictated by the architecture of the receiver.

The lack of flexibility of receiver mode is a substantial disadvantage. For example in a wireless communications receiver, direct conversion may give a compact and low power solution for the reception of wideband signals such as WCDMA, but direct conversion may be unsuitable for reception of narrowband GSM signals.

A second disadvantage of the prior art is that some redundancy in silicon area remains due to the requirement for multiple versions of a given circuit block, i.e. multiple LNAs and filters are required by the receiver of WO02/27953A12, and multiple filters are required by the receiver of EP1006669A1.

It is an object of the present invention to provide an electric circuit which overcomes at least one of the above disadvantages.

According to a first aspect of the present invention there is provided an electric circuit for use as a radio receiver or as part of a radio receiver, the electric circuit comprising:

amplification means for receiving an input signal;

frequency mixer means for receiving an output of the amplification means, the mixer means being configurable to down-convert a wanted component of the amplified input signal to one of at least two intermediate frequency bands;

filter means for receiving an output of the frequency mixer means, the filter means being switchable between at least two filter configurations; and control means coupled to the frequency mixer means and to the filter means for selecting an intermediate frequency band and filter configuration appropriate to the input signal.

The term 'radio receiver' is intended to refer to an electric circuit capable of receiving a radio signal. It is not intended to imply the presence of digital electronics, neither is it intended to exclude the presence of digital electronics. The filter means may be analogue or digital. The term 'radio receiver' is intended to include an electric circuit which is capable of transmitting signals as well as receiving them, i.e. a transceiver.

The invention is advantageous because it allows the circuit operating mode to be changed, for example in response to a change in a wanted input frequency band or communications standard. This allows the circuit operating mode to be selected for optimal reception of different broadcast standards. In addition, the receiver architecture can be dynamically modified to optimise performance under different reception conditions when receiving a given communications standard. For example in one mode of operation of the circuit, the receiver may be configured as a low-IF architecture with two quadrature mixers. If the presence of a high level image signal is detected, the mixers may be reconfigured to provide full complex operation (four mixers) to improve image rejection. In this case, additional circuitry is also required to generate the necessary quadrature RF signals for the full complex mixer.

The invention is very different to the prior art, which provides switching between alternative amplifiers or between alternative filters, but which does not provide switching between circuit operating modes. Since the invention uses a reconfigurable mixer and filter configuration (involving the re-use of individual mixers and filter components), rather than switching between alternative mixer and filter configurations, the semiconductor area required by a semiconductor implementation of the invention is low.

The mixer means may comprise a set of interconnected circuit elements, and the reconfigurability may be provided by switches which modify the interconnections between the circuit elements.

The filter means may comprise a set of interconnected circuit elements, and the reconfigurability may be provided by switches which modify the interconnections between the circuit elements.

The filter means may comprise a set of interconnected circuit elements, and the reconfigurability may be provided via adjustable bias signals or connections internal to the circuit elements, so as to substantially change their operating point or transfer function.

The first and second operating modes may be variously any of zero-IF, quadrature low-IF, complex low-IF, or superheterodyne.

According to a second aspect of the present invention there is provided an electric circuit for use as a radio receiver or as part of a radio receiver, the electric circuit comprising:

amplification means for receiving an input signal;

frequency mixer means for receiving an output of the amplification means, the mixer means comprising a plurality of mixers which can be configured to provide mixer operation in a plurality of modes, at least one of the mixers being reused in different operating modes;

filter means for receiving an output of the frequency mixer means, the filter means being switchable between at least two filter configurations; and control means coupled to the frequency mixer means and to the filter means for selecting a frequency mixer means operating mode and filter configuration appropriate to the input signal.

Specific embodiments of the invention will now be described by way of example only, with reference to the accompanying figures in which.

Figure 1:
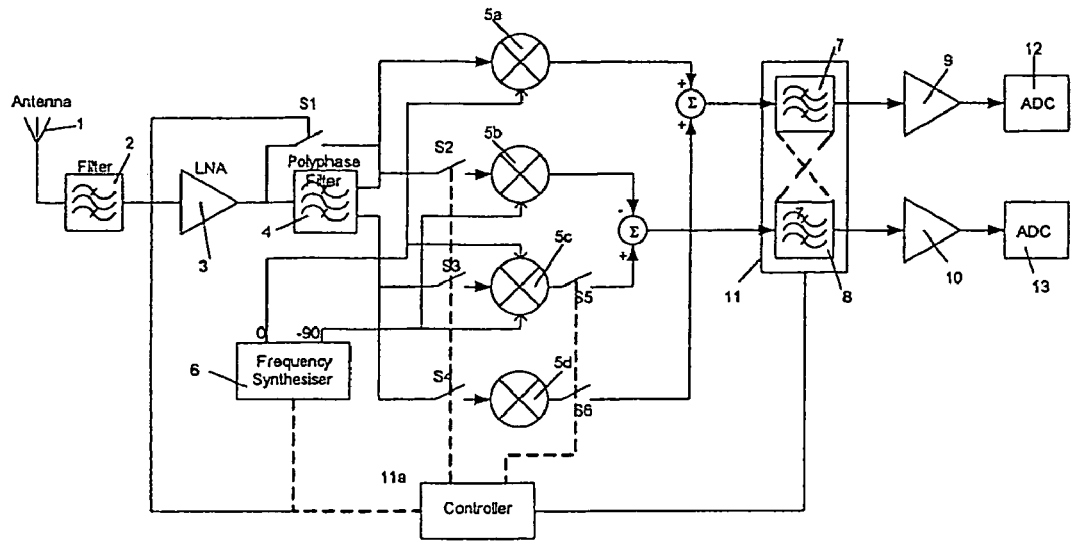
FIG. 1 is a schematic illustration of a radio receiver which embodies the invention.

A radio receiver which embodies the invention is shown in FIG. 1. The receiver, which is reconfigurable, comprises an antenna 1, a bandpass filter 2 and a low noise amplifier (LNA) 3. These common elements are connected to an RF quadrature generator 4 which in this embodiment is shown as a passive polyphase filter, and frequency mixers 5a, 5b, 5c, 5d which are provided with a mixing frequency by a synthesiser 6. Outputs of the quadrature mixers 5a–5d are summed as shown and passed to baseband filters 7, 8, and from the baseband filters to amplifiers 9, 10 and analogue to digital converters 12, 13. As is described below, the baseband filters 9, 10 may be interlinked, and for ease of reference may be referred to as a single entity, baseband filters 11, as shown by box 11.

A controller 11a is coupled to the frequency synthesiser 6 and sets the local oscillator (LO) frequency generated by the synthesiser. The controller is also coupled to the RF filter 4, switches S1–S6, and baseband filters 11, and configures the mixers and filters according to system requirements.

Consider the receiver of FIG. 1 configured for zero-IF operation. In this case the RF polyphase filter 4 is not required and is bypassed by closing switch S1. A quadrature mixer is required, thus mixers 5a and 5b are selected (by closing switch S2). Mixers 5c, 5d are not required and are deselected by open-circuiting switches S3–S6 and/or by powering down these mixers (e.g. by removing the bias current). Baseband filters 11 are configured as two separate lowpass filters.

Consider the receiver of FIG. 1 now configured for quadrature low-IF operation. In this case the mixers are configured in a manner similar to the zero-IF receiver (i.e. S1, S2 closed and S3–S6 open), but now the baseband filters 11 are configured to operate as a single complex bandpass filter centred at the low IF.

Consider the receiver of FIG. 1 now configured as a complex low-IF receiver. In this case the RF polyphase filter 4 is no longer bypassed by switch S1 and thus generates the necessary quadrature RF signals. Mixers 5a, 5b, 5c and 5d are all selected by closing switches S3, S4, S5, S6 to implement a full complex mixer. The baseband filters are configured to provide a complex bandpass filtering function.

Consider the receiver of FIG. 1 now configured as a superheterodyne architecture. The RF polyphase filter 4 is bypassed by closing S1, and only a single real mixer (5a) is required. Mixers 5b, 5c, 5d are thus deselected by opening switches S2, S3, S4, S5, S6 and/or powering down these mixers. For superheterodyne operation, a single real bandpass filter is required for channel selection. Baseband filter 7 may be reconfigured to implement the required bandpass functionality. Alternatively, filter 7 may remain as a lowpass architecture but with sufficient bandwidth to pass the wanted IF channel. Channel selection may then be performed by switching in an additional bandpass filter, or may alternatively be performed in the digital domain after analogue-to-digital conversion. Filter 8 is not required and may be powered down, e.g. by removing the bias current.

Figure 2:
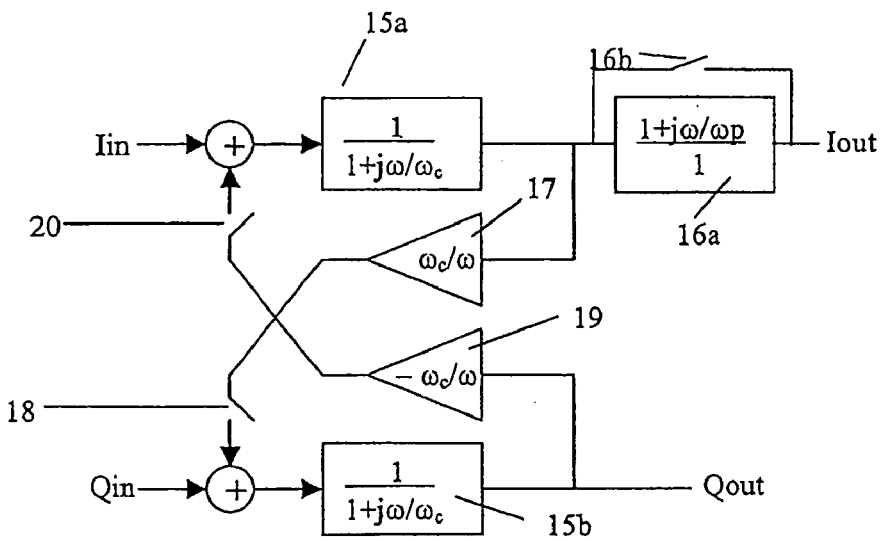
FIG. 2 is a schematic illustration of filters of the radio receiver of FIG. 1.

FIG. 2 shows one possible implementation of the reconfigurable baseband filters 11 for lowpass (zero-IF), complex bandpass (low-IF) and real bandpass (superheterodyne) operational modes. The baseband filters comprise quadrature inputs $I_{in}$ and $Q_{in}$, which are connected to lowpass filters 15a, 15b. Output from a first lowpass filter 15a is passed as feedback via an inverting amplifier 17 and a switch 18 to an input side of the second lowpass filter 15b. Similarly, output from the second lowpass filter 15b is passed as feedback via an inverting amplifier 19 and a switch 20 to an input side of the first lowpass filter 15a. A highpass filter 16 connected to the output of lowpass filter 15a can be selected by opening switch 16b, or deselected (bypassed) by closing switch 16b as required.

When the switches 18, 20 are open and 16b is closed, a dual channel lowpass filter is implemented suitable for zero-IF mode operation. When the switches 18, 20, and 16b are closed, a complex bandpass filter is implemented suitable for low-IF mode operation. When switches 18, 20 and 16b are open, a real banpass filter function is implemented between $I_{in}$ and $I_{out}$ by the cascade of lowpass 15a and highpass 16 filters. This real bandpass filter is thus suitable for superheterodyne operation. By selecting the switches 18, 20 and 16b to be either open or closed, the receiver may be reconfigured between zero-IF, low-IF and superheterodyne modes. In practice a number of the filter arrangements shown in FIG. 2 could be cascaded to implement a higher-order filter.

The analogue front-end of a typical receiver is usually followed by a digital back-end which provides digital post-processing to perform demodulation and decoding functions.

There are many different ways in which component filters 15a, 15b and 16 of the baseband filters 11 may be implemented. The type and/or order of the filters themselves may be varied, for example by switching of their constituent components. The reconfiguration of the filters may involve switching of interconnections between the constituent components of the filters, and/or it may involve switching of the values of the constituent components (by varying bias values or by switching in additional elements).

Figure 3:
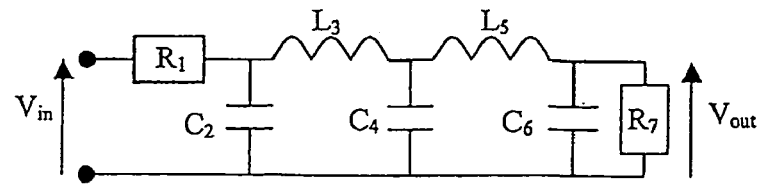
FIG. 3 is a circuit diagram showing a filter which may comprise part of the radio receiver of FIG. 1.
Figure 4:
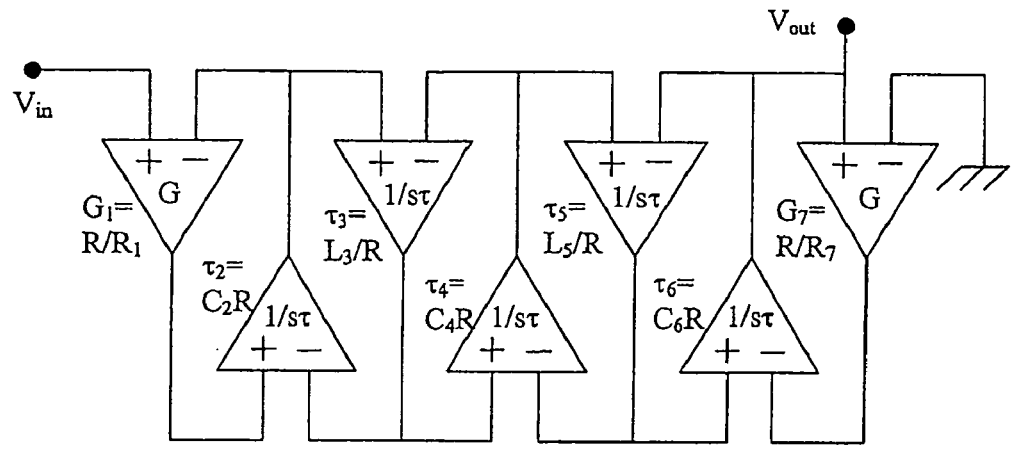
FIG. 4 is a circuit diagram showing an active implementation of the filter of FIG. 3.

An example of a component filter is shown in FIG. 3. The filter is a doubly-terminated passive ladder filter which implements a fifth-order all-pole lowpass function. Since the ladder filter is passive, its transfer function is fixed. FIG. 4 shows an active implementation of a doubly-terminated ladder filter, which has an adjustable transfer function. The implementation of FIG. 4 is based on active simulation of the filter transfer function, and is suitable for integrated circuit realisation. The filter of FIG. 4 is constructed from the interconnection of amplifiers G and integrator sections $1/s\tau$, where various integrator time constants $\tau$ determine the pole locations of the filter. By tuning the pole locations (i.e. by varying the integrator time constants), the filter transfer function can be varied, for example from a Chebyshev to a Butterworth response.

Figure 5:
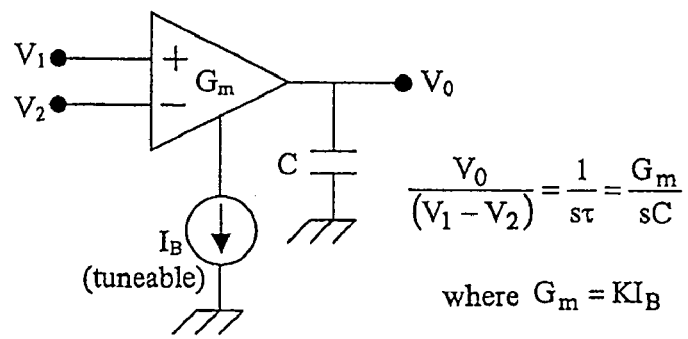
FIG. 5 is a circuit diagram showing part of the filter of FIG. 4.

FIG. 5 shows an integrator configuration which allows easy tuning of the time constant $\tau$. The integrator is a transconductor-capacitor ($G_m$–C) structure. The value of the transconductance $G_m$ depends on the bias current $I_B$. By tuning $I_B$, the integrator time constant changes. Constructing the filter of FIG. 4 using integrators of the type shown in FIG. 5 allows convenient variation of the filter transfer function via tuning of the integrators.

Figure 6:
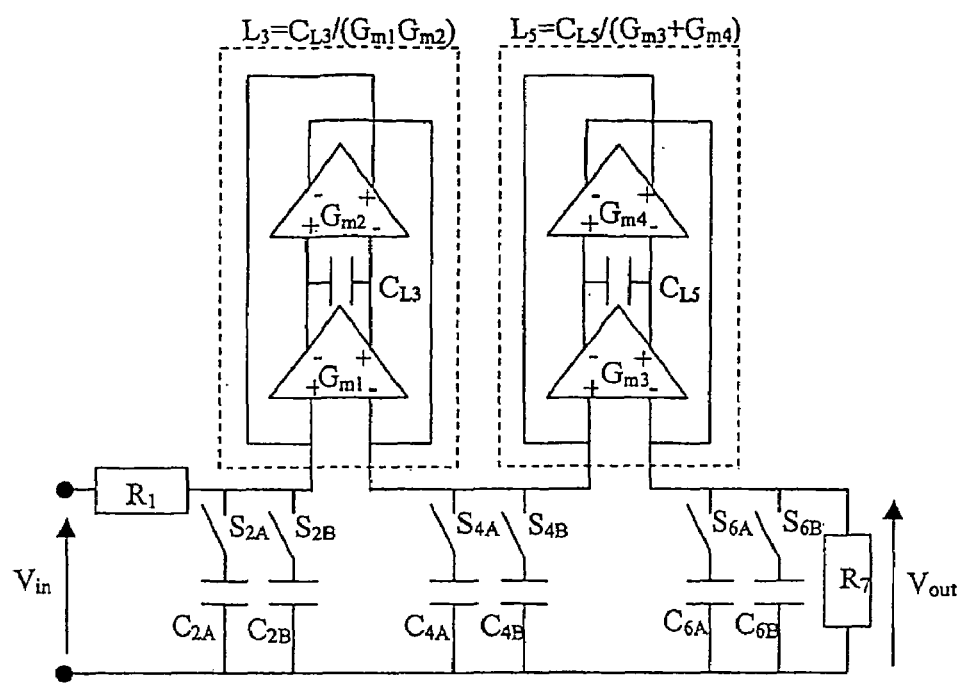
FIG. 6 is a circuit diagram showing an alternative active implementation of the filter of FIG. 3.

An alternative active simulation of the doubly-terminated ladder filter of FIG. 3 is shown in FIG. 6. In this circuit the inductors of the passive circuit are simulated using active gyrators formed from transconductors $G_m$ and capacitors $C_L$. In this instance, the value of a given simulated inductor is determined by the $G_m$–C elements used to simulate that inductor. To alter the filter response from, for example, a Chebyshev to a Butterworth response, it is not sufficient to simply tune the transconductances of the transconductors, since this will change only the effective inductor values. The values of the capacitors must also be altered. This is achieved by switching in or out additional capacitors $C_2$, $C_4$, $C_6$ using switches $S_2, S_4, S_6$ as shown in FIG. 6.

Figure 7:
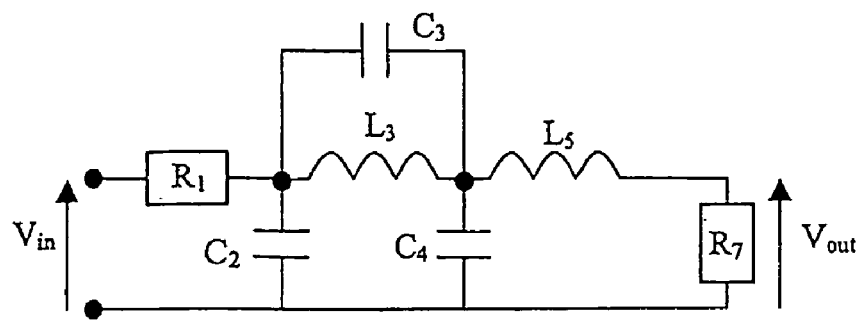
FIG. 7 is a circuit diagram showing an alternative filter which may comprise part of the radio receiver of FIG. 1.
Figure 8:
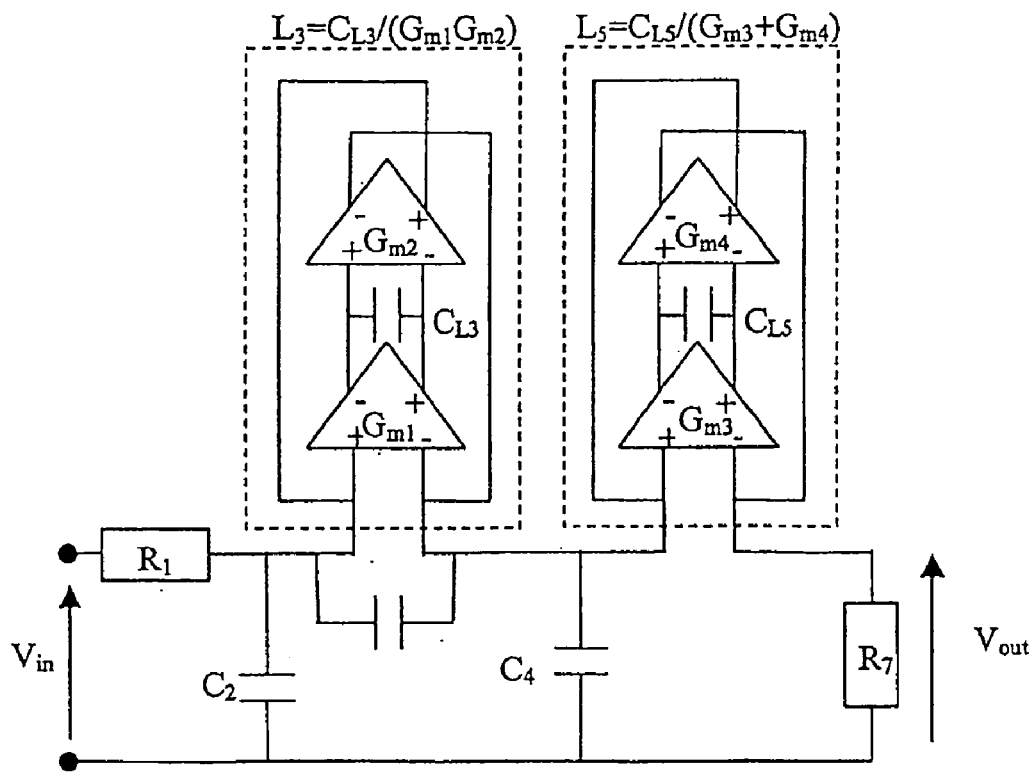
FIG. 8 is a circuit diagram showing an active implementation of the filter of FIG. 7.

FIG. 7 shows an alternative example of a component filter. The filter is a doubly-terminated passive ladder filter which implements a fourth-order elliptic filter. FIG. 8 shows an active implementation of the filter, based upon active simulation of inductor values, which can be implemented on an integrated circuit. The filter of FIG. 8 is based upon gyrators formed from transconductors $G_m$ and capacitors $C_L$.

Figure 9:
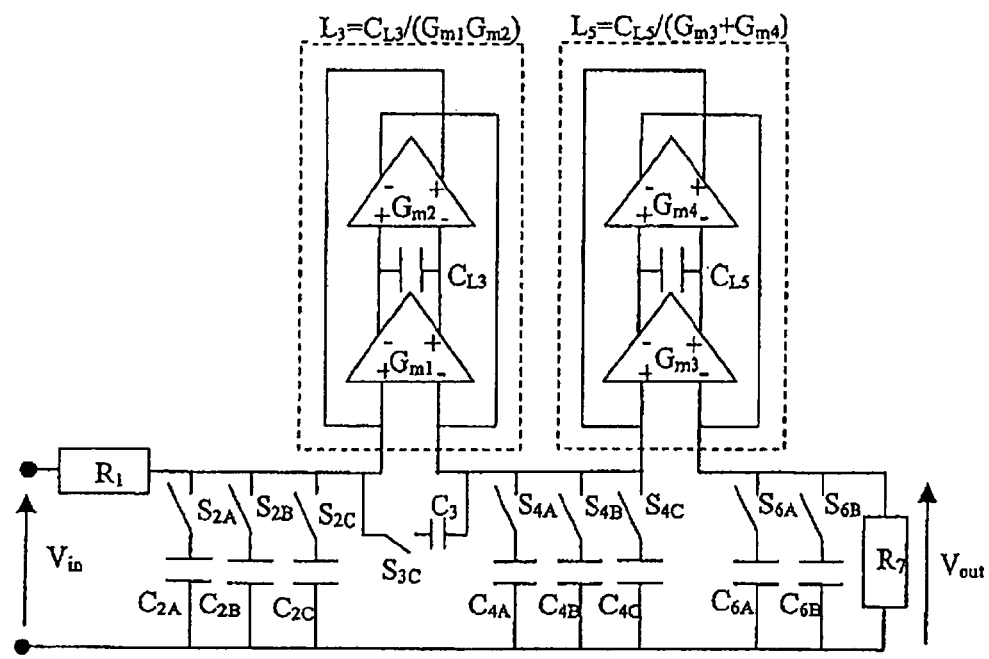
FIG. 9 is a circuit diagram showing an active implementation of the filters of FIGS. 3 and 7.

From a comparison of the filters shown in FIGS. 6 and 8 it can be seen that these can be conveniently combined as a single circuit. The combined circuit is shown in FIG. 9. The configuration of the combined circuit of FIG. 9 may be varied between three different settings, (i) lowpass fifth-order Chebyshev, (ii) lowpass fifth-order Butterworth, and (iii) lowpass fourth-order elliptic. This is achieved as follows:

(i) with switches $S_{2A}$, $S_{4A}$ and $S_{6A}$ shut and all others open, and with transconductors $G_{m1}$–$G_{m4}$ tuned to appropriate values, the circuit implements a lowpass all-pole filter with particular characteristics, e.g. a Chebyshev response.

(ii) with switches $S_{2B}$, $S_{4B}$ and $S_{6B}$ shut and all others open, and with transconductors $G_{m1}$–$G_{m4}$ tuned to appropriate values, the circuit implements a lowpass all-pole filter with a different transfer function to that in (i), e.g. a Butterworth response, (iii) with switches $S_{2C}$, $S_{3C}$ and $S_{4C}$ shut and all others open, and with transconductors $G_{m1}$–$G_{m4}$ tuned to appropriate values, the circuit implements a lowpass elliptic filter.

The filter examples described in relation to FIGS. 3 to 9 are merely illustrative. It will be appreciated that many different filters, different to those in FIGS. 3 to 9, may be implemented.

Figure 10:
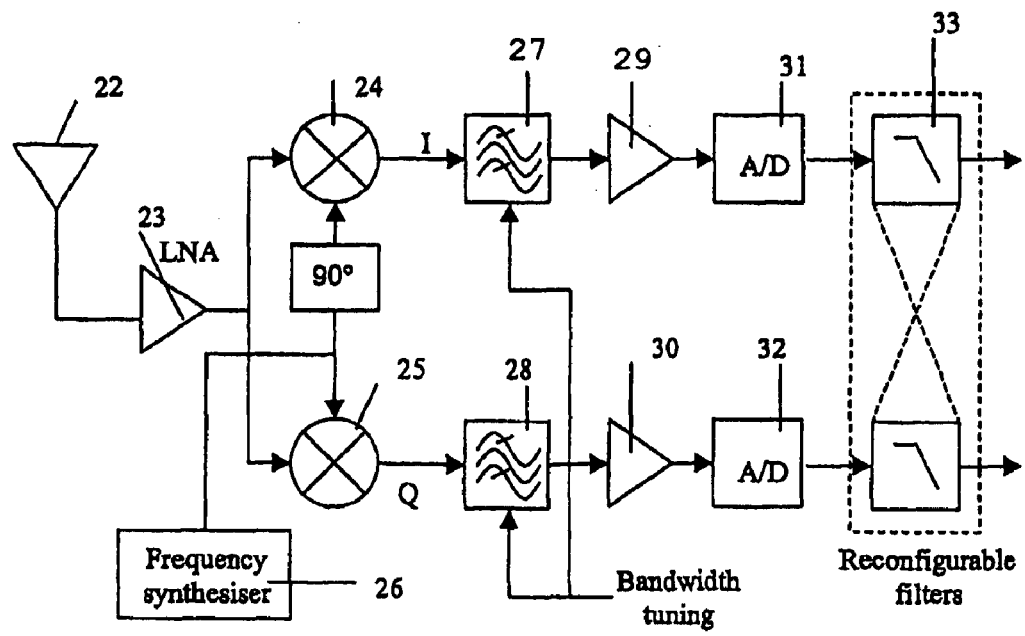
FIG. 10 is a schematic diagram of an alternative radio receiver which embodies the invention.

FIG. 10 shows an alternative implementation of a radio receiver which can be reconfigured between zero-IF, low-IF and superheterodyne modes of operation. In this case, the analogue filters are lowpass filters, and the mode reconfiguration is implemented in the digital domain. The receiver comprises an antenna 22, a low noise amplifier (LNA) 23, and two quadrature frequency mixers 24, 25 which are provided with an operating frequency by a synthesiser 26. Outputs of the quadrature mixers 24, 25 pass to analogue lowpass filters 27, 28 and via amplifiers 29, 30 to analogue to digital converters 31, 32. Outputs of the analogue to digital converters 31, 32 pass to reconfigurable digital filters 33.

Figure 11:
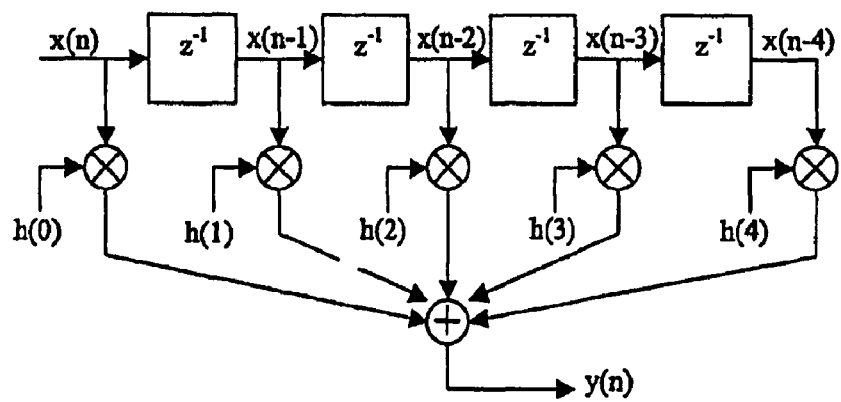
FIG. 11 is a schematic diagram showing a finite impulse response (FIR) digital filter.

In operation, when a zero-IF mode of operation is required, the analogue lowpass filters 27, 28 are tuned to the appropriate frequency to allow the wanted channel through, but reject the adjacent channel signal. After the analogue to digital conversion, the digital processing circuitry implements the necessary demodulation and decoding functions. If the wanted channel is a narrowband signal, the analogue lowpass filters 27, 28 may be configured not to reject all of the adjacent channel signal but merely act as anti-aliasing filters for the subsequent analogue to digital conversion. This will relax the design constraints on the analogue bandpass filters 27, 28 allowing a more compact design. In this case, the digital circuitry after the analogue to digital converter will first perform lowpass channel select filtering prior to demodulation and decoding functions. A suitable lowpass digital filter could be a finite impulse response (FIR) filter with an appropriate number of taps. FIG. 11 shows an example FIR filter structure whereby the output signal y(n) is formed from a summation of the weighted outputs of cascaded delay sections ($z^{-1}$). The transfer function of the filter depends on the number of delay sections (number of taps), and the relative magnitude of the weights h(0), h(1) etc.

If a low-IF mode of operation is required, the analogue lowpass filters 27, 28 are retuned (for example by varying the filter bias currents) such that the whole of the baseband bandwidth up to (and including) the wanted channel at the low intermediate frequency (IF) is passed through the analogue lowpass filters 27, 28. The analogue to digital converters 31, 32 will convert the whole of this signal to the digital domain. The digital filters are configured such that they implement complex bandpass filtering, rather than lowpass filtering used in the zero-IF case. For example the FIR structure may be maintained but with modified weights and number of taps. The weight values h(0), h(1) etc. can be changed by updating values stored in digital weight registers, while the number of taps may be increased or decreased by switching in or out additional cascaded delay sections.

For superheterodyne operation, a quadrature receiver architecture is not required and circuits in the lower quadrature branch of FIG. 10 are deselected. The analogue lowpass filter 27 is retuned as in the low-IF mode such that the whole of the baseband bandwidth up to (and including) the wanted channel at the low intermediate frequency (IF) is passed through the analogue lowpass filters 27. The analogue to digital converter 31 will convert the whole of this signal to the digital domain. The digital filter is configured such that a real bandpass filter function is implemented, rather than lowpass filtering or complex bandpass filtering used in the zero-IF and low-IF cases.

An advantage of performing the filter reconfiguration in the digital domain is that digital circuits are easier to reconfigure than analogue circuits, and in addition the complex filters can be implemented with greater matching accuracy (i.e. greater image rejection). However the penalty is a higher ADC conversion bandwidth and thus increased power consumption.

Figure 12:
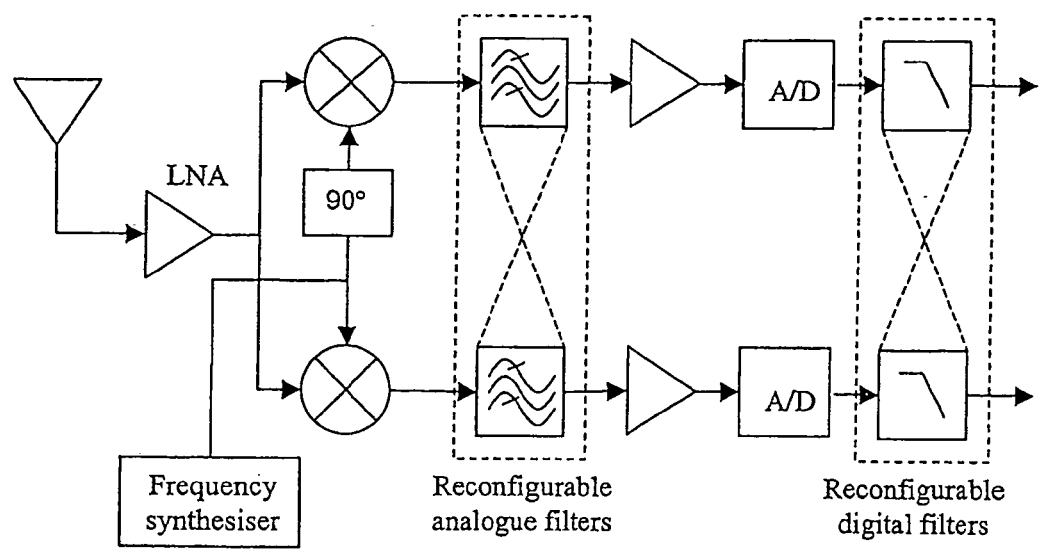
FIG. 12 is a schematic diagram of a further alternative radio receiver which embodies the invention.

The receiver may be implemented such that both the analogue and digital baseband filters can be reconfigured. In this way, the analogue filters could be fairly narrowband lowpass structures (for a zero-IF receiver), or they may be wideband lowpass filters with complex bandpass filters in the digital domain (for a low-IF digital IR approach), or they may be wideband lowpass filters with real bandpass filters in the digital domain (for a superhet approach); alternatively, the analogue filters may be configured as complex bandpass structures (for a low-IF analogue IR approach). A receiver having reconfigurable analogue and digital baseband filters is shown schematically in FIG. 12.

The various circuit blocks such as LNA, mixers, etc may be reconfigured by varying their bias values so as to be optimised for a different frequency band or standard.

The various circuit blocks such as LNA, mixers, etc may also be switchable such that as the baseband is reconfigured, the front-end circuit elements are also switched so as to be optimised for a different frequency band or standard.

Although the described embodiments of the invention are receiver architectures, it will be appreciated that the invention may also be implemented in an architecture in which the integrated circuit front-end is capable of performing a transmitter function, i.e. an RF transceiver architecture.

The invention claimed is:

1. An electric circuit for use as a radio receiver or as part of a radio receiver, the electric circuit comprising:
    amplification means for receiving an analogue input signal;
    analogue frequency mixer means for receiving an output of the amplification means, the mixer means comprising a plurality of mixers being switchable into and out of use in order to configure the mixer means to downconvert a wanted component of the amplified input signal to one of at least two intermediate frequency bands, at least one of the mixers being reused for different configurations of the frequency mixer means;
    analogue filter means for receiving an output of the frequency mixer means, the filter means being switchable between at least two filter configurations; and
    control means coupled to the frequency mixer means and to the filter means and capable of selecting a frequency mixer means operating mode and filter configuration appropriate to the input signal to provide at least two of a low-IF, zero-IF, and superheterodyne architecture.

2. An electric circuit according to claim 1, the frequency mixer comprising four mixers configurable to provide at least two of:
    a quadrature mixer for zero-IF use; and
    a fully complex mixer for low-IF use; and
    a single real mixer for superheterodyne use.

3. An electric circuit according to claim 1, wherein the filter means comprises a set of interconnected circuit elements, and switches which modify the interconnections between the circuit elements.

4. An electric circuit according to claim 1, wherein the filter means comprises a set of interconnected circuit elements, and means for providing adjustable bias signals or connections internal to the circuit elements, so as to substantially change their operating point or transfer function of the filter means.

5. An electric circuit according to claim 1, wherein one of said filter configurations is a low pass configuration for zero-IF use.

6. An electric circuit according to claim 1, wherein one of said filter configurations is a complex bandpass configuration for low-IF use.

7. An electric circuit according to claim 1, wherein one of said filter configurations is a real bandpass configuration for superheterodyne use.

8. An electric circuit according to claim 1, wherein the filter means provides quadrature inputs and quadrature outputs, the filter means being switchable to allow feedback to be passed from the quadrature outputs to opposite quadrature inputs.

9. An electric circuit according to claim 1, wherein the filter means comprises amplifiers and integrators arranged to simulate a passive filter, the time constants of the integrators being adjustable to adjust the filter means' transfer function.

10. An electric circuit according to claim 9, wherein the integrator is a transconductor capacitor structure having a tuneable bias current.

11. An electric circuit according to claim 1, wherein the filter means comprises transconductors and capacitors arranged to form active gyrators.

12. An electric circuit according to claim 11, wherein the transconductors are provided with tuneable bias currents, and the capacitors are provided with switches which may be used to switch the capacitors into or out of the filter active gyrators.

13. An electric circuit according to claim 1, wherein the filter means implements an all-pole lowpass filter.

14. An electric circuit according to claim 13, wherein the filter means is dynamically reconfigurable between the all-pole lowpass filter implementation and the elliptic filter implementation.

15. An electric circuit according to claim 1, wherein the filter means implements an elliptic filter.

16. An electric circuit according to claim 15, wherein the filter means is dynamically reconfigurable between the all-pole lowpass filter implementation and the elliptic filter implementation.

17. An electric circuit according to claim 1, wherein the filter means comprises a finite input response filter with adjustable delay sections and weights.

18. An electric circuit according to claim 1 and comprising detection means coupled to receive at an input the output of the filter means for extracting modulation information therefrom, the detection means being coupled to the control means so that the control means can switch the detection means between at least two operating modes.

19. An electric circuit according to claim 18, wherein the detection means can be switched between at least a real value and a complex modulus operating mode.

20. An electric circuit according to claim 1, wherein said filter means comprises a plurality of filters which can be switched into and out of use, at least one of the filters being reused in different filter configurations.

* * * * *